(12) United States Patent
Yang et al.

(10) Patent No.: US 12,424,723 B2
(45) Date of Patent: Sep. 23, 2025

(54) CIRCUIT WITH FIRST AND SECOND TERMINALS COUPLED TOGETHER VIA A BRANCH-INTERCONNECTION ARRANGEMENT

(71) Applicant: NXP B.V., Eindhoven (NL)

(72) Inventors: Xin Yang, Houten (NL); Mustafa Acar, Eindhoven (NL); Zhe Chen, Eindhoven (NL); Dominicus Martinus Wilhelmus Leenaerts, Riethoven (NL)

(73) Assignee: NXP B.V., Eindhoven (NL)

( * ) Notice: Subject to any disclaimer, the term of this patent is extended or adjusted under 35 U.S.C. 154(b) by 137 days.

(21) Appl. No.: 18/459,815

(22) Filed: Sep. 1, 2023

(65) Prior Publication Data

US 2024/0106101 A1 Mar. 28, 2024

(30) Foreign Application Priority Data

Sep. 21, 2022 (EP) ..................................... 22196946

(51) Int. Cl.
*H01P 5/12* (2006.01)
(52) U.S. Cl.
CPC ..................................... *H01P 5/12* (2013.01)
(58) Field of Classification Search
CPC ....................................................... H01P 5/12
See application file for complete search history.

(56) References Cited

U.S. PATENT DOCUMENTS

| 5,648,740 A | 7/1997 | Devilin et al. |
| 6,005,442 A | 12/1999 | Maeda et al. |

(Continued)

FOREIGN PATENT DOCUMENTS

| CN | 107707218 A | 2/2018 |
| CN | 113675623 A | 11/2021 |

(Continued)

OTHER PUBLICATIONS

Arash Ebrahimi Jarihani et al.: "A Phase Coherent 7-bit Digital Step Attenuator on 0.18um SOI" 12th European Microwave Integrated Circuits Conference, Nuremberg, Germany, Oct. 9-10, 2017, 4 pages.

(Continued)

*Primary Examiner* — Menatoallah Youssef
*Assistant Examiner* — Khareem E Almo (57) ABSTRACT

A circuit includes a common terminal, a first terminal, and a second terminal. The common terminal is coupled to first and second circuit branches at a branch node. The first and second circuit branches include a first and second quarter wavelength transmission line having a first end coupled to the branch node and a second end coupled to the first and second terminals. The first and second terminals are coupled together via a branch-interconnection arrangement. The circuit includes a first switched arrangement with a first switch having a first and second switch-terminal. The first switch-terminal is coupled to the common terminal, and a first resistor and a first capacitor are arranged in parallel and coupled between the second switch-terminal and a reference terminal. The circuit also includes a second switched arrangement coupled to the first terminal. The first quarter wavelength transmission line is coupled between the first and second switched arrangements.

19 Claims, 5 Drawing Sheets

(56) References Cited

U.S. PATENT DOCUMENTS

| | | | |
|---|---|---|---|
| 10,193,531 B2 | 1/2019 | Shrivastava | |
| 10,862,524 B2* | 12/2020 | Hoogzaad | H04B 1/48 |
| 2003/0132814 A1 | 7/2003 | Nyberg | |
| 2010/0097119 A1* | 4/2010 | Ma | H01P 1/15 |
| | | | 327/427 |
| 2011/0273248 A1 | 11/2011 | Nicolson et al. | |
| 2018/0062621 A1 | 3/2018 | Yan et al. | |
| 2018/0241122 A1* | 8/2018 | Jalali Mazlouman | H01Q 3/34 |
| 2022/0190459 A1* | 6/2022 | Yang | H03H 7/06 |
| 2023/0170871 A1 | 6/2023 | Yang et al. | |
| 2024/0098906 A1* | 3/2024 | Yang | H05K 1/025 |
| 2024/0106101 A1* | 3/2024 | Yang | H03H 7/25 |
| 2024/0258676 A1* | 8/2024 | Slaton | H01P 5/18 |

FOREIGN PATENT DOCUMENTS

| | | |
|---|---|---|
| EP | 3934095 A1 | 1/2022 |
| JP | H06 177616 A | 6/1994 |
| JP | H07 312508 A | 11/1995 |
| JP | 2016208220 A | 12/2016 |
| WO | 2016150484 A1 | 9/2016 |

OTHER PUBLICATIONS

Byung-Wook Min et al.: "A 10-50-GHz CMOS Distributed Step Attenuator With Low Loss and Low Phase Imbalance" IEEE Journal of Solid-State Circuits, vol. 42, No. 11, Nov. 2007, pp. 2547-2554.

Wooram Lee et al.: "Fully Integrated 94-GHz Dual-Polarized TX and RX Phased Array Chipset in SiGe BiCMOS Operating up to 105 oC" IEEE Journal of Solid-State Circuits, vol. 53, No. 9, Sep. 2018, pp. 2512-2531.

Ge Feng et al.: "Design of Beam Forming Network For Satellite-Borne Phased Array", 2021 International Applied Computational Electromagnetics Society Symposium, Jul. 28, 2021, pp. 1-2.

Li Nayu et al: "A DC-28-GHz 7-Bit High-Accuracy Digital-Step Attenuator in 55-nm CMOS", IEEE Microwave and Wireless Components Letters, IEEE Service Center, New York, vol. 32, No. 2, Oct. 29, 2021, pp. 157-160.

U.S. Appl. No. 18/459,759, filed Sep. 1, 2023, not yet published, 34 pages.

* cited by examiner

Figure 8

CIRCUIT WITH FIRST AND SECOND TERMINALS COUPLED TOGETHER VIA A BRANCH-INTERCONNECTION ARRANGEMENT

CROSS-REFERENCE TO RELATED APPLICATIONS

This application claims priority under 35 U.S.C. § 119 to European patent application no. 22196946.2, filed 21 Sep. 2022, the contents of which are incorporated by reference herein.

FIELD

The present disclosure relates to a circuit comprising at least a first branch and a second branch that may provide a power splitter and/or power combiner. It also relates to such a circuit in combination with an attenuation part.

BACKGROUND

An attenuator provides for attenuation of a signal. In one or more examples, the attenuator may be configured to include one or more switches such that the attenuation may be selectively provided. An example measure of the performance of an attenuator is the gain-to-phase error. The use of the one or more switches may negatively impact the gain-to-phase error.

SUMMARY

According to a first aspect of the present disclosure there is provided a circuit that includes a common terminal and at least a first terminal and a second terminal. The common terminal is coupled to a first circuit branch at a branch node and the first circuit branch terminates at the first terminal. The common terminal is coupled to a second circuit branch at the branch node and the second circuit branch terminates at the second terminal. The first circuit branch includes a first quarter wavelength transmission line having a first end coupled to the branch node and a second end coupled to the first terminal. The second circuit branch includes a second quarter wavelength transmission line having a first end coupled to the branch node and a second end coupled to the second terminal. The first terminal and the second terminal are coupled together via a branch-interconnection arrangement comprising at least a resistor. The circuit includes a first switched arrangement and a second switch arrangement. The first switch arrangement includes a first switch having a first switch-terminal and a second switch-terminal. The first switch-terminal is coupled to the common terminal. A first resistor and a first capacitor are arranged in parallel and coupled between the second switch-terminal and a reference terminal, and the reference terminal is configured to be coupled to a reference voltage. The second switched arrangement includes a second switch having a first switch-terminal and a second switch-terminal, wherein the first switch-terminal is coupled to the first terminal. A second resistor and a second capacitor are arranged in parallel and coupled between the second switch-terminal and the reference terminal. The first quarter wavelength transmission line is coupled between the first switched arrangement and the second switched arrangement.

In one or more embodiments, the branch-interconnection arrangement includes a series-connected first resistor and a second resistor having an intermediate node therebetween, where the first switch-terminal of the second switched arrangement is connected to the intermediate node.

In one or more embodiments, the branch-interconnection arrangement includes a first capacitor in series between the first terminal and the first resistor and comprises a second capacitor in series between the second resistor and the second terminal.

In one or more embodiments, with respect to the branch-interconnection arrangement, the resistance of the first resistor is equal to the resistance of the second resistor.

In one or more embodiments, with respect to the branch-interconnection arrangement, the capacitance of the first capacitor is equal to the capacitance of the second capacitor.

In one or more embodiments, the circuit provides a power splitter/combiner between the common terminal and both the first terminal and the second terminal with selectively provided attenuation, where the circuit is configured to provide an attenuation mode in which the first switch and the second switch are on and a bypass mode in which the first switch and the second switch are off.

In one or more embodiments, the second switched arrangement is coupled directly to the first terminal and the circuit further includes a third switched arrangement with a third switch having a first switch-terminal and a second switch-terminal. The first switch-terminal is connected to the second terminal. A third resistor and a third capacitor are arranged in parallel and coupled between the second switch-terminal and the reference terminal. The second quarter wavelength transmission line is coupled between the first switched arrangement and the third switched arrangement.

In one or more embodiments, the branch-interconnection arrangement includes a first resistor with a first resistor terminal coupled to the first terminal and a second resistor terminal coupled to a first node, a second resistor with a first resistor terminal coupled to the first node and a second resistor terminal coupled to a second node, and a first capacitor comprising a first capacitor terminal coupled to the second node and a second capacitor terminal coupled to the second terminal of the circuit.

In one or more embodiments, the branch-interconnection arrangement further includes a fourth switch in parallel with the second resistor connected between the first node and the second node.

In one or more embodiments, the circuit is configured to provide a bypass mode in which the first switch, the second switch and the third switch are off and the fourth switch is on to thereby provide isolation between the first terminal and the second terminal.

In one or more embodiments, the circuit is configured to provide an attenuation mode in which the first switch, the second switch and the third switch are on and the fourth switch is off.

In one or more embodiments, the capacitance of one or both of the first capacitor and the second capacitor is greater than the off-state capacitance of the both the first switch and the second switch.

In one or more embodiments, the circuit includes a Wilkinson power splitter/combiner.

In one or more embodiments, the circuit includes a third terminal and the common terminal is coupled to a third circuit branch at the branch node and the third circuit branch terminates at the third terminal. The third circuit branch includes a third quarter wavelength transmission line having a first end coupled to the branch node and a second end coupled to the third terminal. The third terminal and the second terminal are coupled together via a branch-interconnection arrangement comprising at least a resistor. The circuit includes a fourth switched arrangement with a fourth switch having a first switch-terminal and a second switch-terminal. The first switch-terminal is coupled to the third terminal. A second resistor and a second capacitor are arranged in parallel and coupled between the second switch-terminal and the reference terminal. The third quarter wavelength transmission line is coupled between the fourth switched arrangement and the first switched arrangement.

According to a second aspect of the present disclosure there is provided analog beamformer including the circuit of the first aspect where the first terminal is configured to couple to a first antenna and the second terminal is configured to couple to a second antenna.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF THE DRAWINGS

One or more embodiments will now be described by way of example only with reference to the accompanying drawings in which.

DETAILED DESCRIPTION

An attenuator is configured to receive a signal at its input, reduce the power of the signal and provide the reduced-power signal at its output. In one or more examples, the attenuation provided by an attenuator may be selectively provided. Thus, in one or more examples, the attenuator may include one or more switches to connect and/or disconnect one or more components in a circuit to selectively provide the attenuation. In one or more examples, the attenuator may include one or more resistive and/or capacitive components that are tuneable to provide for control of the level of attenuation provided by the attenuator.

An example measure of the performance of an attenuator is the gain-to-phase error. The use of the one or more switches may negatively impact the gain-to-phase error. One or more example embodiments herein may provide an attenuator configured to selectively provide attenuation with advantageous gain-to-phase error performance.

Figure 1:
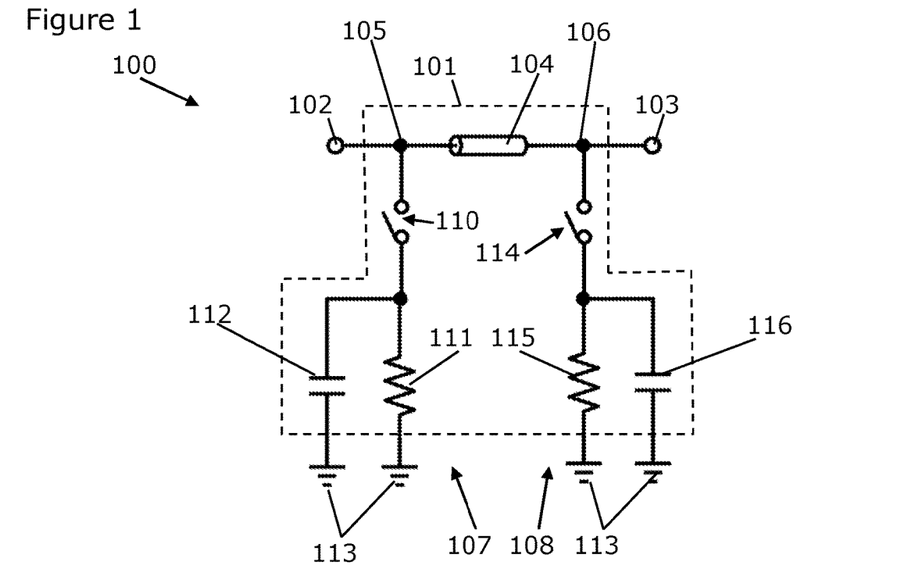
FIG. 1 shows an example embodiment of a circuit comprising an attenuator part.

Example FIG. 1 shows a circuit 100 comprising a digital attenuator part 101. In the example of FIG. 1 the digital attenuator part 101 may be considered to comprise a digital step attenuator and, in particular, a one-bit digital step attenuator. In other examples, a plurality of digital attenuator parts 101 may be provided in series to thereby provide a multi-bit digital step attenuator. However, for simplicity, a one-bit implementation of the circuit 100 comprising a single attenuator part will be described.

The circuit 100 comprises a first attenuator terminal 102, which may comprise an input terminal for a signal to be selectively attenuated. The circuit 100 further comprises a second attenuator terminal 103, which may comprise an output terminal for the selectively attenuated signal provided at the input terminal. It will be appreciated that the input and output terminals may be reversed as this example implementation is not unidirectional.

The attenuator part 101 comprises a first inductor 104 having a first terminal 105 coupled to the first attenuator terminal 102 and a second terminal 106 coupled to the second attenuator terminal 103. In this and one or more examples, the first inductor 104 comprises or be part of a quarter-wavelength impedance transformer with respect to an operating frequency of the circuit 100. Further, in one or more examples, the first inductor 104 is embodied as a quarter wavelength transmission line. In one or more examples, it will be appreciated that a transmission line may be embodied as a pi-network (e.g. C-L-C) or as one or more or two or more series-shunt networks (e.g. L C L C L C . . . ). Accordingly, the first inductor 104 may be embodied as a pi-network or as one or more series-shunt network.

The attenuator part 101 comprises a first switched arrangement 107 and a second switched arrangement 108 coupled to opposite ends of the transmission line 104 (or to corresponding terminals 105, 106 of the inductor/pi network).

The first switched arrangement comprises a first switch 110 having a first switch-terminal and a second switch-terminal, wherein the first switch-terminal is coupled to the first terminal 105 of the first inductor 104. The first switched arrangement 107 further comprises a first resistor 111 and a first capacitor 112 arranged in parallel and coupled between the second switch-terminal and a reference terminal shown, in this example, as ground 113. However, it will be appreciated that the reference terminal may be configured to be coupled to any other reference voltage, as required.

Similarly, the second switched arrangement 108 comprises a second switch 114 having a first switch-terminal and a second switch-terminal, wherein the first switch-terminal is coupled to the second terminal 106 of the first inductor 104. The second switched arrangement 108 further comprises a second resistor 115 and a second capacitor 116 arranged in parallel and coupled between the second switch-terminal and ground 113.

In the one or more examples the first resistor 111 has the same resistance as the second resistor 115. However, in other examples, the resistances may differ. Further, in this and one or more other examples, the first capacitor 112 has the same capacitance as the second capacitor 116. However, in other examples, the capacitances may differ.

The first and second switches 110, 114 may be implemented as transistors in one or more examples.

Control of the first switch 110 and the second switch 114 provides the selective attenuation of the circuit 100. Thus, the digital step attenuator part 101 may be configured to provide an attenuation mode in which a signal provided at the first terminal 102 and output at second terminal 103 would be attenuated. Further the digital step attenuator part 101 may be configured to provide a bypass mode in which the attenuation is not provided and the signal provided at the input passes through the transmission line 104 and is output at the second terminal 103 without the attenuation.

In the attenuation mode both the first switch 110 and the second switch 114 are closed (i.e. on) to thereby provide the attenuation. In the bypass mode both the first switch 110 and the second switch 114 are open (i.e. off).

Figure 2:
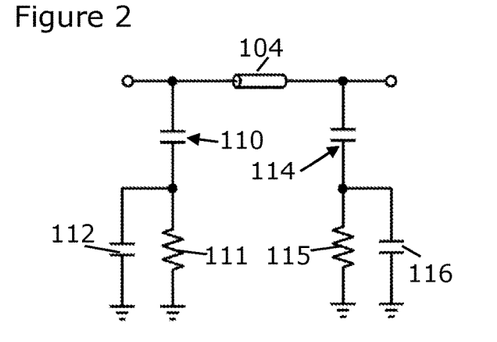
FIG. 2 shows the effective circuit of FIG. 1 when the switches of the attenuator part are off (i.e. open)
Figure 3:
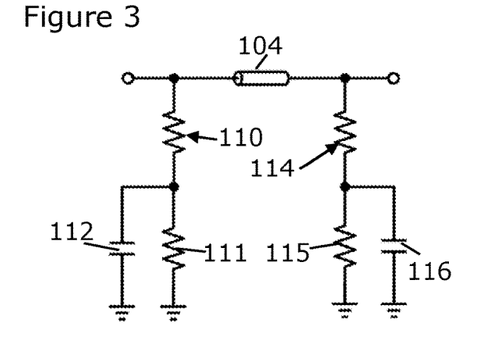
FIG. 3 shows the effective circuit of FIG. 1 when the switches of the attenuator part are on (i.e. closed)

When the first switch 110 and the second switch 114 are in the off state, the switches present a parasitic capacitance $C_{off}$, as shown in FIG. 2 which replaces the switches with symbolic capacitors. This capacitance introduces a capacitive load impedance in parallel with the quarter wavelength transmission line 104. In attenuation mode, if the first capacitor 112 and the second capacitor 116 were not present, the first and second switched arrangements 107, 108 would present only a resistive load, comprising the on-resistance of the switches 110, 114 and the resistance of the first resistor 111 and the second resistor 115. The effective circuit with the switches in the on state is shown in FIG. 3 which replaces the switches with symbolic resistors. Without wishing to be bound by theory, it is thought that this difference in the capacitive loading and pure resistive loading between bypass and attenuation mode is the cause of much of the Gain-to-Phase error. However, as shown in FIG. 1, the present example includes the first capacitor 112 and the second capacitor 116 such that in the attenuation mode, with the first switch 110 and the second switch 114 in the on state, the first capacitor 112 and the second capacitor 116 provide a capacitance similar to the bypass mode. Providing a circuit that presents this capacitance in both the attenuation mode and the bypass mode may, in one or more examples, provide for a reduction in the gain-to-phase error of the attenuator part 101.

Further, the capacitance of the first capacitor 112 and the second capacitor 116 may be configured to achieve the same capacitive loading and the same phase shifting between the bypass and attenuation modes, which may mean a zero Gian-to-Phase error at an operating (e.g. center) frequency of the circuit 100. In other examples, some gain-to-phase error may be acceptable and therefore the capacitance of the first capacitor 112 and the second capacitor 116 may be configured such that the capacitive loading and/or the phase shifting introduced by the first and second switched arrangements 107, 108 between the bypass and attenuation modes is within a predetermined threshold.

As an example, the first inductor or transmission line 104 may have an impedance of 53 Ohms. The off-state capacitance of the first switch 110 and the second switch 114 may comprise 5 femtofarads. The resistance of the first and second resistors 111, 115 may comprise 71 Ohms. The capacitance of the first capacitor 112 and the second capacitor 116 may comprise 12 femtofarads. Thus, in one or more examples, the capacitance of the first capacitor 112 and the second capacitor 116 may be greater than the parasitic off state capacitance of the first switch 110 and the second switch 114.

In one or more examples, the resistance, $R_{att}$, of the first and second resistors 111, 115 may comprise:

$$R_{att} > \frac{2\omega C_{off} R_{on}^2}{1 - 2\omega C_{off} R_{on}}$$

wherein Ron comprises the on-state resistance of the first switch 110 and the second switch 114 and ω represents angular frequency representing the operating frequency of the circuit 100. Thus, given a specific switch 110, 112 having a characteristic Ron and $C_{off}$, and an operational frequency (w), the equation provides the minimum value of $R_{att}$, which sets up the maximum attenuation ratio of the attenuation.

In one or more examples, the capacitance, $C_{ATT}$, of the first capacitor 112 and the second capacitor 116 is broadly defined by:

$$C_{off} < C_{att} < \frac{R_{att} + R_{on}}{\omega R_{att} R_{on}}$$

In more general terms and in one or more examples, $C_{att}$ may be greater than $C_{off}$.

In one or more examples, an estimated solution for $C_{att}$ is:

$$C_{att} \approx C_{off} \left(1 + \frac{R_{on}}{R_{att}}\right)^2$$

Figure 4:
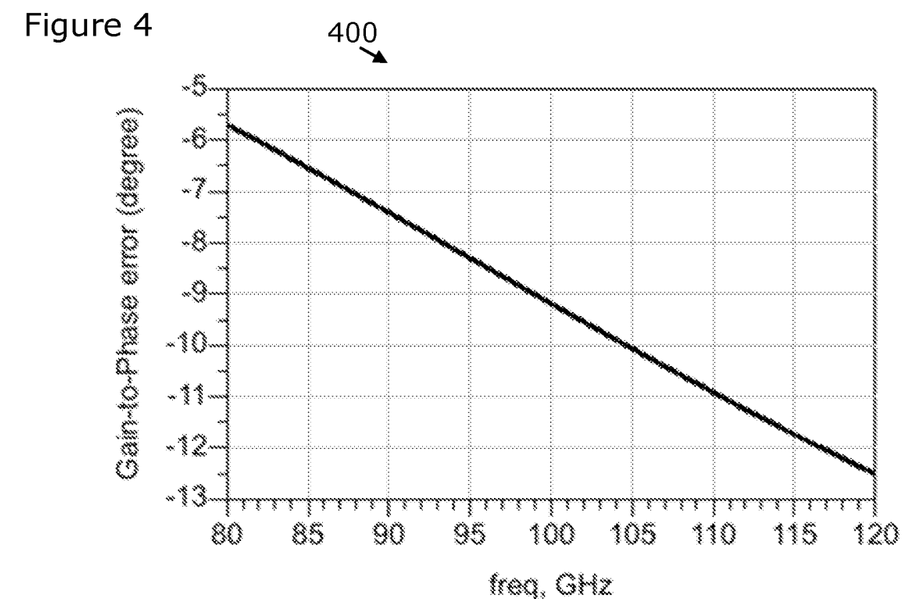
FIG. 4 shows a graph of gain-to-phase error versus frequency of a signal provided to an attenuator.
Figure 5:
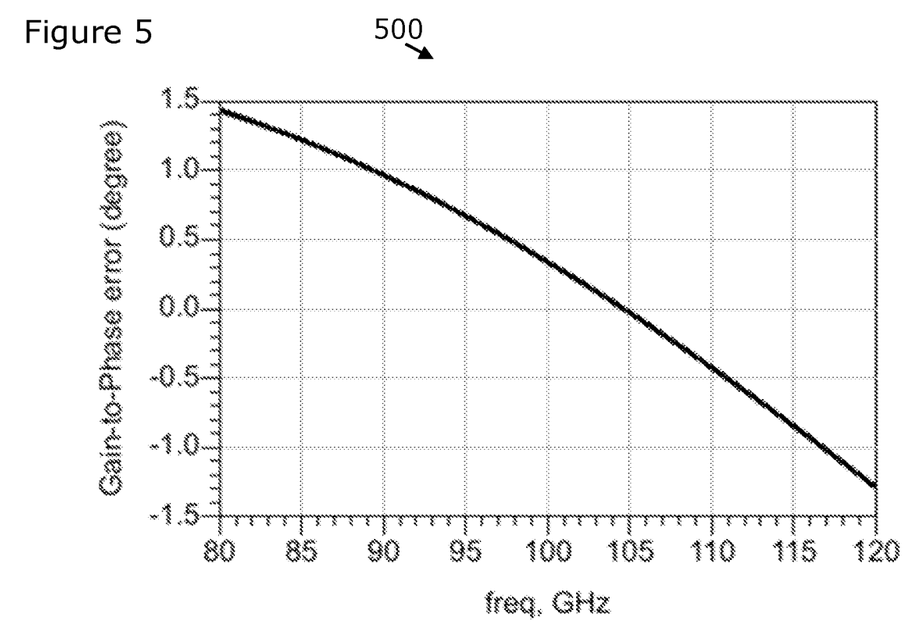
FIG. 5 shows a graph of gain-to-phase error versus frequency of a signal provided to the attenuator part of FIG. 1.

FIGS. 4 and 5 show simulated performance of different implementations of a one bit 4-dB Digital Step Attenuator. The y-axis shows Gain-to-Phase error, wherein Gain-to-Phase error is defined as bypass mode S21 phase (in degrees) minus attenuation mode S21 phase (in degrees).

FIG. 4 shows a graph of the gain-to-phase error versus frequency of a signal provided to a known attenuator that does not include the first capacitor 112 nor second capacitor 116. The known attenuator is configured to provide an attenuation step of 4-dB. It will be appreciated that there is a significant change in gain-to-phase error with frequency as well as deviating from zero significantly. FIG. 5 shows an example graph of gain-to-phase error versus frequency of a signal provided to the circuit 100 of FIG. 1, which is also configured to provide an attenuation step of 4-dB. The scale of the y-axis showing gain-to-phase error is different to FIG. 4 and shows a flatter or more stable gain-to-phase error with frequency as well as a gain-to-phase error close to zero over a predetermined range of frequencies around the centre operating frequency of the circuit.

As mentioned above the circuit 100 may be configured as a multi-bit attenuator (not shown) and may therefore comprise a first attenuator part 101 and be provided in combination with at least a second attenuator part. The second attenuator part has the same construction as first attenuator part 101, and has its first (input) terminal 102 coupled to the output terminal 103 of the first attenuator part 101.

Analog Front End Implementation

Figure 6:
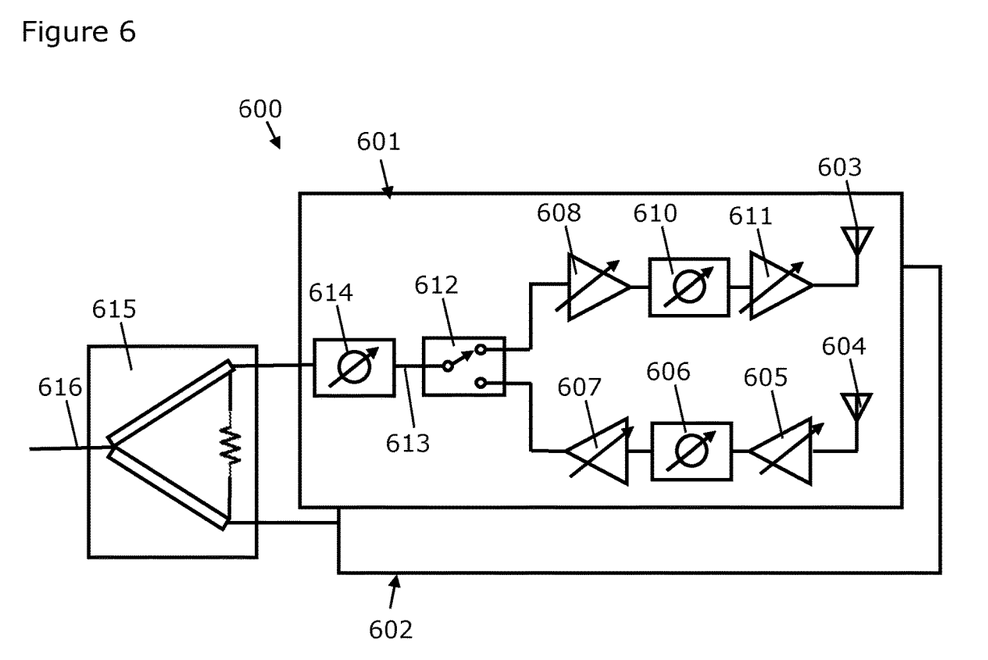
FIG. 6 shows an example front end module of a transmitter/receiver, which may comprise an analog beamformer.

Example FIG. 6 shows a typical implementation of an analog front end of a transmitter/receiver, which may comprise an analog beamformer for millimetre wave operation.

FIG. 6 shows a typical block diagram of 2-channel analog beamformer 600. The device comprises two channels comprising a first channel 601 and a second channel 602, although other numbers of channels may be provided. Each channel 601, 602 may comprise a transmit path and/or a receive path that is couplable to a respective transmit antenna 603 and a receive antenna 604. In other examples, the antenna may be shared. The receive path comprises amplifier 605, a phase shifter 606, and a further amplifier 607. The transmit path comprises amplifier 608, phase shifter 610 and further amplifier 611. The amplifiers 605, 607, 608 and 611 may comprise amplifiers with gain control (for example, they may be Variable Gain Amplifiers or multi-stage amplifiers cascading with DSA). In other examples, the transmit path and the receive path may comprise other components such as at least one amplifier. The device may comprise a TX/RX switch 612 which is configured to select either the transmit path or the receive path for a common terminal 613. A typical implementation of the TX/RX switch 612 is a quarter wavelength switch.

The common terminal 613 may be coupled to a common-leg phase shifter 614 for the channel 601 serving for both the transmit and receive paths. A Wilkinson power splitter/combiner 615 may be provided to split (or combine) the transmit power of the signal from a further common node 616 to the first channel 601 and second channel 602 (or combine the power from the first channel 601 and the second channel 602 towards the common node 616).

Similar to the attenuator part 101 described above, the Wilkinson power splitter/combiner 615 includes a quarter wavelength transmission line. In particular, the Wilkinson power splitter/combiner 615 comprises two quarter wavelength transmission lines for a two-channel implementation. The analog front end 600 thus uses a Wilkinson power splitter/combiner 615 having a quarter wavelength transmission line and may also require the functionality of the attenuator part 101, which also uses a quarter wavelength transmission line. A quarter wavelength transmission line occupies significant chip area. Hence, instead of cascading the quarter wavelength transmission line based digital step attenuator 101 with other blocks, the following example embodiment combines the functionality of the Wilkinson power splitter/combiner 615 and the attenuator part 101 to provide a space efficient selectively attenuating power splitter/combiner.

It will be appreciated that a quarter wavelength transmission line may be embodied using lumped elements having a L-C arrangement.

Figure 7:
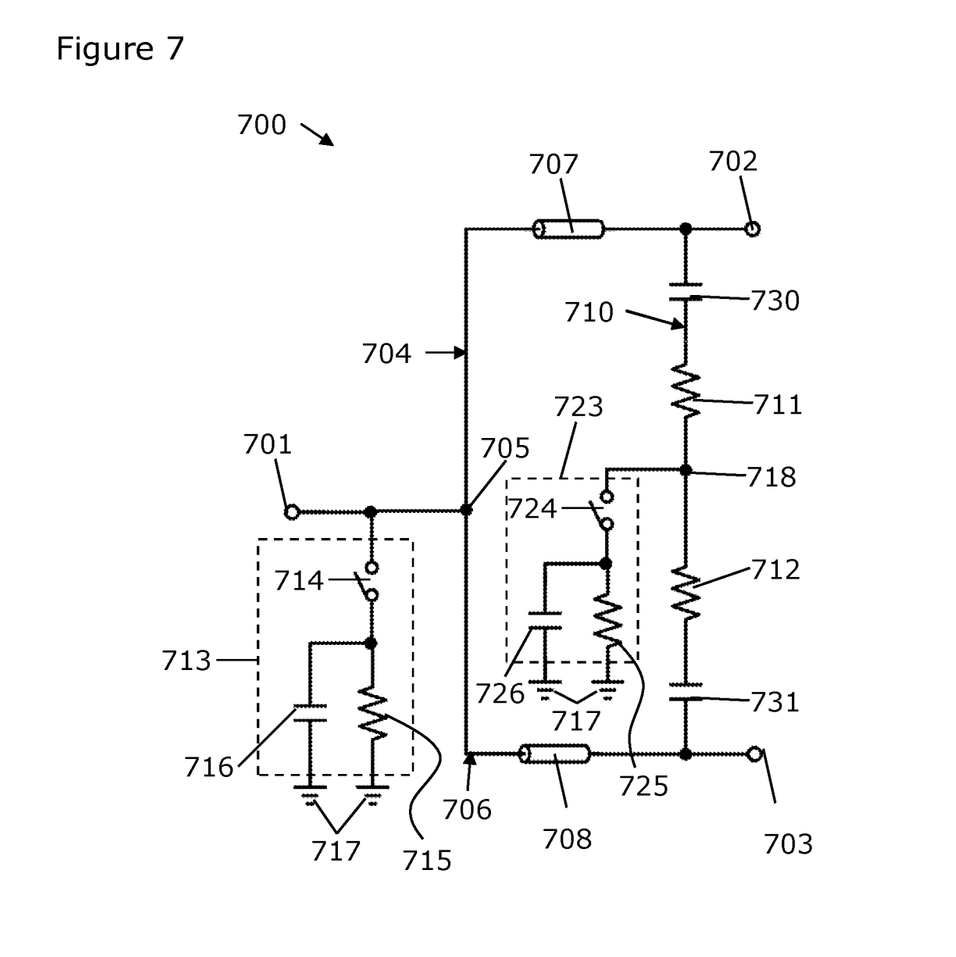
FIG. 7 shows a first example embodiment of a circuit configured to act as a power splitter and/or power combiner that includes the attenuator part.

Such an example embodiment is shown in FIG. 7. FIG. 7 shows an example circuit 700 comprising an integration of a power splitter/combiner that also has the advantageous attenuation functionality of the attenuator part 101 while being space efficient.

The circuit 700 comprises a common terminal 701 and at least a first terminal 702 and a second terminal 703. It will be appreciated that a power splitter/combiner may couple a common terminal to more than two other terminals in other examples. The common terminal 701 is coupled to a first circuit branch 704 at a branch node 705 and the first circuit branch 704 terminates at the first terminal 702. Further, the common terminal 701 is coupled to a second circuit branch 706 at the branch node 705 and the second circuit branch 706 terminates at the second terminal 703. In the schematic diagram of FIG. 7, the common terminal is connected to the branch node 705 but it will be appreciated that the branch node 705 may be located directly at the common terminal 701.

The first circuit branch 704 includes a first quarter wavelength transmission line 707 having a first end coupled to the branch node 705 and a second end coupled to the first terminal 702. Likewise, the second circuit branch 706 includes a second quarter wavelength transmission line 708 having a first end coupled to the branch node 705 and a second end coupled to the second terminal 703. Further branches, if present, will likewise include a quarter wavelength transmission line. The quarter wavelength transmission lines, in other examples, may be implemented as lumped inductors configured as quarter wavelength impedance transformers.

As with a conventional Wilkinson Power splitter/combiner the first terminal 702 and the second terminal 703 are coupled together via a branch-interconnection arrangement 710 comprising at least a resistor 711, 712. The branch-interconnection arrangement 710 is configured to provide isolation between the first terminal 702 and the second terminal 703, as will be understood by those skilled in the art.

The attenuation part 101 is integrated into circuit 700 as follows. A first switched arrangement 713 is provided comprising a first switch 714 having a first switch-terminal and a second switch-terminal, wherein the first switch-terminal is coupled to the common terminal 701 or branch node 705. A first resistor 715 and a first capacitor 716 are arranged in parallel and coupled between the second switch-terminal and a reference terminal. In the present example, the reference terminal comprises ground 717. A second switched arrangement 723 is provided comprising a second switch 724 having a first switch-terminal and a second switch-terminal, wherein the first switch-terminal is coupled to the first terminal 702. A second resistor 725 and a second capacitor 726 are arranged in parallel and coupled between the second switch-terminal and the reference terminal 717.

Further, the first quarter wavelength transmission line 707 is coupled between the first switched arrangement 713 and the second switched arrangement 723, similar to as shown in FIG. 1.

In the present example, the first switch-terminal of the second switch 724 of the second switched arrangement 723 can equally be said to be coupled to the second terminal 703. Likewise, the second quarter wavelength transmission line 708 is coupled between the first switched arrangement 713 and the second switched arrangement 723.

More particularly, in the example embodiment of FIG. 7, the branch-interconnection arrangement 710 comprises the series-connected, first resistor 711 and the second resistor 712 having an intermediate node 718 therebetween. The first switch-terminal of the second switch 724 of the second switched arrangement 723 is connected to the intermediate node 718.

Further, in one or more examples, the branch-interconnection arrangement 710 comprises a first capacitor 730 in series between the first terminal 702 and the first resistor 711 and comprises a second capacitor 731 in series between the second resistor 712 and the second terminal 703. It has been found that at least in this example embodiment, a series-RC isolation network, as provided by the branch-interconnection arrangement 710, has a wider isolation frequency bandwidth relative to a parallel-RC isolation network. However, in other examples, where wider isolation bandwidth is not required, a parallel RC isolation network may be provided.

In the present example, the resistance of the first resistor 711 is equal to the resistance of the second resistor 712. Further, in the present example, the capacitance of the first capacitor 730 is equal to the capacitance of the second capacitor 731. However, depending on the whether the power should be split/combined evenly, the resistors and capacitors of the branch-interconnection arrangement 710 may have differing values.

As an example only, for an operating frequency of approximately 100 Ghz, capacitance of the first/second capacitor 730, 731 is around 128 femtofarads. Further, the resistance of the first/second resistor 711, 712 is around 46 Ohm.

Thus, the circuit 700 provides a power splitter/combiner between the common terminal 701 and both the first terminal 702 and the second terminal 703 with selectively provided attenuation. The circuit 700 is thus configured to provide an attenuation mode in which the first switch 714 and the second switch 724 are on and therefore the power splitter/combiner provides for attenuation of the signal being split and/or the signal being combined.

The circuit 700 may be further configured to provide a bypass mode in which the first switch 714 and the second switch 724 are off and therefore the power splitter/combiner provides no additional attenuation (beyond what the splitter/combiner would inherently provide) of the signal being split and/or the signal being combined.

Figure 8:
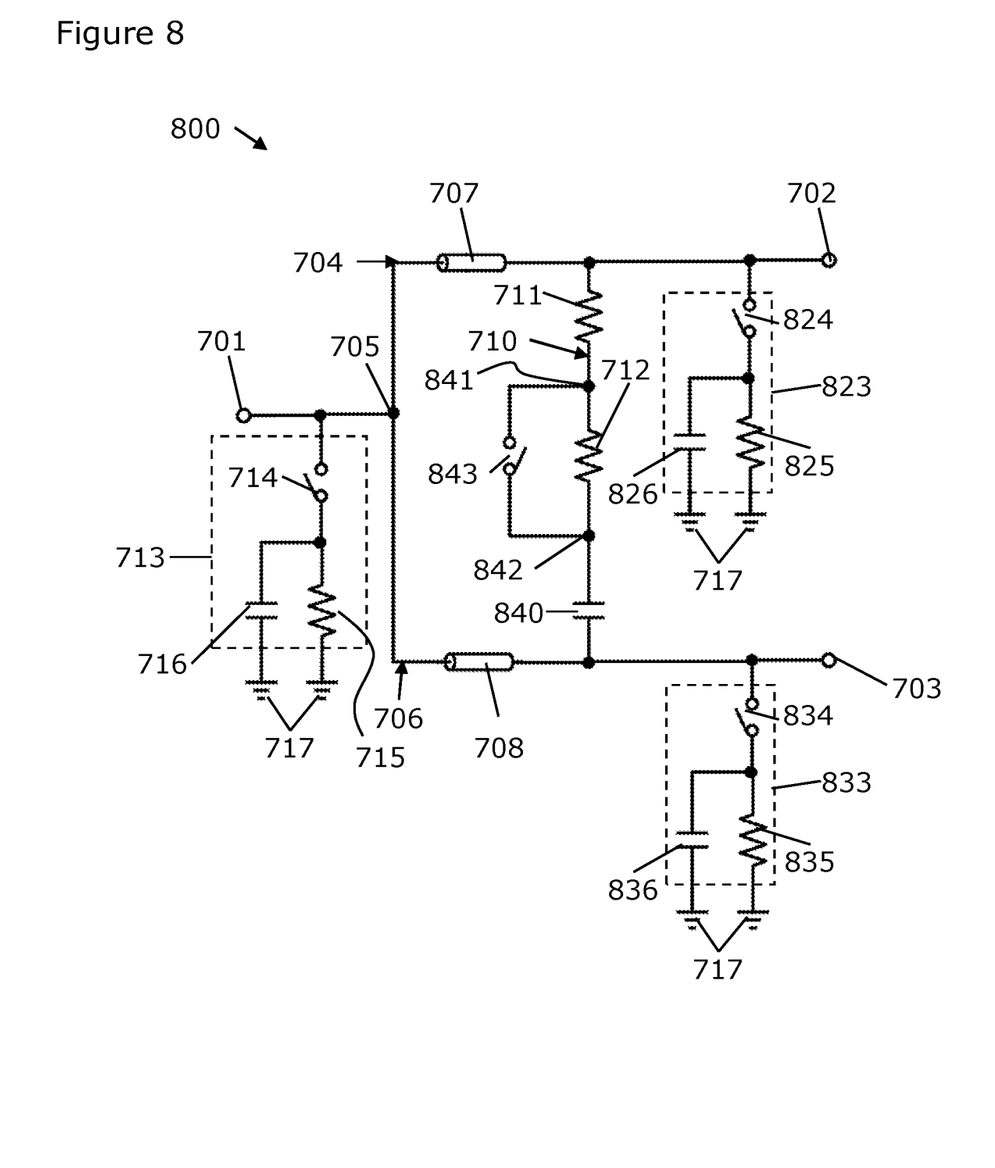
FIG. 8 shows a second example embodiment of a circuit configured to act as a power splitter and/or power combiner that includes the attenuator part.

FIG. 8 shows a second example embodiment of the power splitter/combiner with integrated attenuation, referenced as circuit 800, that is suitable for greater attenuation ratios, such as 4 dB relative to 2 dB of the FIG. 7 embodiment.

The same reference numerals have been used for similar parts. However, the parts that differ have been given reference numerals beginning 8xx.

In the example embodiment of FIG. 8, the second switched arrangement 823 is not connected to the branch-interconnection arrangement 710. Instead, it is coupled directly to the first terminal 702. Thus, for completeness, the second switched arrangement 823 is provided comprising a second switch 824 having a first switch-terminal and a second switch-terminal, wherein the first switch-terminal is coupled directly to the first terminal 702 outside of the branch-interconnection arrangement 710. A second resistor 825 and a second capacitor 826 are arranged in parallel and coupled between the second switch-terminal and the reference terminal 717.

In this and one or more other example embodiments, the circuit comprises a third switched arrangement 833. The third switched arrangement 833 comprises a third switch 834 having a first switch-terminal and a second switch-terminal, wherein the first switch-terminal is connected directly to the second terminal 703. The third switched arrangement 833 is of a similar arrangement of components and comprises a third resistor 835 and a third capacitor 836 arranged in parallel and coupled between the second switch-terminal and the reference terminal 717.

In this example, the second quarter wavelength transmission line 708 is coupled between the first switched arrangement 713 and the third switched arrangement 833. As before, the first quarter wavelength transmission line 707 is coupled between the first switched arrangement 713 and the second switched arrangement 823.

In this example embodiment, the branch-interconnection arrangement 710 of circuit 800 comprises a first resistor 711, a second resistor 712 and a first capacitor 840 in series. The first resistor 711 comprises a first resistor terminal coupled to the first terminal 702 and a second resistor terminal coupled to a first node 841. The second resistor 712 comprises a first resistor terminal coupled to the first node 841 and a second resistor terminal coupled to a second node 842. The first capacitor 840 comprises a first capacitor terminal coupled to the second node 842 and a second capacitor terminal coupled to the second terminal 703 of the circuit 800.

In the example of FIG. 8, the branch-interconnection arrangement 710 further comprises a fourth switch 843 in parallel with the second resistor 712 and connected between the first node 841 and the second node 842.

We will now describe the operation of the circuit 800. The circuit 800 is configured to provide a bypass mode in which the first switch 714, the second switch 824 and the third switch 834 are off. The fourth switch 843 is on to thereby provide isolation between the first terminal 702 and the second terminal 703 by virtue of the branch-interconnection arrangement 710.

The circuit 800 is configured to provide an attenuation mode in which the first switch 714, the second switch 824 and the third switch 834 are on and the fourth switch 843 is off. In this mode, a signal passing from the common terminal 701 to both the first and second terminals 702, 703 is attenuated. Likewise, in this mode, a signal passing from both the first and second terminals 702, 703 to the common terminal 701 is attenuated.

The second switch 824 and the third switch 834 and the corresponding branch-interconnection arrangement (acting as an attenuation network) 710 provide low-Ohmic loading for high attenuation, and they also provide an isolation path between the first terminal 702 and the second terminal 703. Hence fourth switch 843 is turned off to "disable" the isolation RC network provided by the branch-interconnection arrangement 710 and maintain the isolation between the first and second terminals 702, 703. It should be noted that the term "disable" is used to give an intuitive explanation. Due to the off-state capacitance of the fourth switch 843 it is more realistic to state that the fourth switch 843 is turned off to optimize the impedance of isolation network provided by the branch-interconnection arrangement 710 including first capacitor 840.

In testing of the circuit 800 it has been found that it can achieve a 4-dB attenuation with Return Loss better than −15 dB, and isolation better than −20 dB, and a Gain-to-Phase error within ±0.5 degrees.

In a further example, not shown, the circuit 800 includes a third terminal. In such an arrangement, the common terminal 701 would be coupled to a third circuit branch at the branch node 705 and the third circuit branch terminates at the third terminal. The third circuit branch would include a third quarter wavelength transmission line having a first end coupled to the branch node 705 and a second end coupled to the third terminal. The third terminal and the second terminal would be coupled together via a second branch-interconnection arrangement comprising at least a resistor, and may be similar to the series RC arrangement shown in FIGS. 7 and 8. Further such a circuit would comprises a fourth switched arrangement of the same form as the others, wherein the third quarter wavelength transmission line is coupled between the fourth switched arrangement and the first switched arrangement. Following this configuration, a power splitter/combiner with controllable attenuation may be provided for any number of terminals.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

What is claimed is:

1. A circuit comprising:
a common terminal and at least a first terminal and a second terminal, wherein the common terminal is coupled to a first circuit branch at a branch node and the first circuit branch terminates at the first terminal, and wherein the common terminal is coupled to a second circuit branch at the branch node and the second circuit branch terminates at the second terminal,
wherein the first circuit branch includes a first quarter wavelength transmission line having a first end electrically coupled to the branch node and a second end electrically coupled to the first terminal,
wherein the second circuit branch includes a second quarter wavelength transmission line having a first end electrically coupled to the branch node and a second end electrically coupled to the second terminal, and
wherein the first terminal and the second terminal are coupled together via a branch-interconnection arrangement comprising at least a first resistor;
a first switched arrangement comprising a first switch having a first switch-terminal and a second switch-terminal, wherein the first switch-terminal is coupled to the common terminal, and wherein a second resistor and a first capacitor are arranged in parallel and coupled between the second switch-terminal and a reference terminal, the reference terminal configured to be coupled to a reference voltage; and
a second switched arrangement comprising a second switch having a third switch-terminal and a fourth switch-terminal, wherein the third switch-terminal is coupled to the first terminal, and wherein a third resistor and a second capacitor are arranged in parallel and coupled between the fourth switch-terminal and the reference terminal, wherein the first quarter wavelength transmission line is coupled between the first switched arrangement and the second switched arrangement.

2. The circuit of claim 1, wherein the branch-interconnection arrangement comprises the first resistor coupled in series with a fourth resistor having an intermediate node therebetween, wherein the third switch-terminal of the second switched arrangement is connected to the intermediate node.

3. The circuit of claim 2, wherein the branch-interconnection arrangement comprises a third capacitor in series between the first terminal and the first resistor and comprises a fourth capacitor in series between the fourth resistor and the second terminal.

4. The circuit of claim 2, wherein, with respect to the branch-interconnection arrangement, a resistance of the first resistor is equal to a resistance of the fourth resistor.

5. The circuit of claim 2, wherein, with respect to the branch-interconnection arrangement, a capacitance of the third capacitor is equal to a capacitance of the fourth capacitor.

6. The circuit of claim 1, wherein the circuit provides a power splitter/combiner between the common terminal and both the first terminal and the second terminal with selectively provided attenuation, wherein the circuit is configured to provide an attenuation mode in which the first switch and the second switch are on.

7. The circuit of claim 1, wherein the circuit provides a power splitter/combiner between the common terminal and both the first terminal and the second terminal with selectively provided attenuation, wherein the circuit is configured to provide a bypass mode in which the first switch and the second switch are off.

8. A circuit comprising:
a common terminal;
a first terminal;
a second terminal;
a first circuit branch, wherein the common terminal is coupled to the first circuit branch at a branch node and the first circuit branch terminates at the first terminal, and wherein the first circuit branch includes a first quarter wavelength transmission line having a first end coupled to the branch node and a second end coupled to the first terminal;
a second circuit branch, wherein the common terminal is coupled to the second circuit branch at the branch node and the second circuit branch terminates at the second terminal, and wherein the second circuit branch includes a second quarter wavelength transmission line having a first end coupled to the branch node and a second end coupled to the second terminal;
a branch-interconnection arrangement that includes a first resistor, wherein the first terminal and the second terminal are coupled together via the branch-interconnection arrangement;
a first switched arrangement comprising a first switch having a first switch-terminal and a second switch-terminal, wherein the first switch-terminal is coupled to the common terminal, and wherein a second resistor and a first capacitor are arranged in parallel and coupled between the second switch-terminal and a reference terminal, the reference terminal configured to be coupled to a reference voltage;
a second switched arrangement coupled directly to the first terminal, wherein the second switched arrangement comprises a second switch having a third switch-terminal and a fourth switch-terminal, wherein the third switch-terminal is coupled to the first terminal, and wherein a third resistor and a second capacitor are arranged in parallel and coupled between the fourth switch-terminal and the reference terminal, and wherein the first quarter wavelength transmission line is coupled between the first switched arrangement and the second switched arrangement; and
a third switched arrangement comprising a third switch having a fifth switch-terminal and a sixth switch-terminal, wherein the fifth switch-terminal is connected to the second terminal, and wherein a fourth resistor and a third capacitor are arranged in parallel and coupled between the sixth switch-terminal and the reference terminal, and wherein the second quarter wavelength transmission line is coupled between the first switched arrangement and the third switched arrangement.

9. The circuit of claim 8, wherein:
the first resistor comprises a first resistor terminal coupled to the first terminal and a second resistor terminal coupled to a first node, and
wherein the branch-interconnection arrangement further comprises
a fifth resistor comprising a first resistor terminal coupled to the first node and a second resistor terminal coupled to a second node; and
a fourth capacitor comprising a first capacitor terminal coupled to the second node and a second capacitor terminal coupled to the second terminal of the circuit.

10. The circuit of claim 9, wherein the branch-interconnection arrangement further comprises:
a fourth switch in parallel with the fifth resistor connected between the first node and the second node.

11. The circuit of claim 10, wherein the circuit is configured to provide a bypass mode in which the first switch, the second switch and the third switch are off and the fourth switch is on to thereby provide isolation between the first terminal and the second terminal.

12. The circuit of claim 10, wherein the circuit is configured to provide an attenuation mode in which the first switch, the second switch and the third switch are on and the fourth switch is off.

13. The circuit of claim 1, wherein a capacitance of one of the first capacitor and the second capacitor is greater than an off-state capacitance of both the first switch and the second switch.

14. The circuit of claim 1, wherein a capacitance of both of the first capacitor and the second capacitor is greater than an off-state capacitance of both the first switch and the second switch.

15. The circuit of claim 1 comprising a Wilkinson power splitter/combiner.

16. The circuit of claim 1, wherein the circuit includes a third terminal and the common terminal is coupled to a third circuit branch at the branch node and the third circuit branch terminates at the third terminal;
wherein the third circuit branch includes a third quarter wavelength transmission line having a first end coupled to the branch node and a second end coupled to the third terminal;
wherein the third terminal and the second terminal are coupled together via a branch-interconnection arrangement comprising at least a resistor;
wherein the circuit comprises:
a fourth switched arrangement comprising a fourth switch having a fifth switch-terminal and a sixth switch-terminal, wherein the fifth switch-terminal is coupled to the third terminal, and wherein a second resistor and a second capacitor are arranged in parallel and coupled between the sixth switch-terminal and the reference terminal, wherein the third quarter wavelength transmission line is coupled between the fourth switched arrangement and the first switched arrangement.

17. An analog beamformer circuit comprising:
a common terminal;
a first terminal, wherein the first terminal is configured to couple to a first antenna;
a second terminal, wherein the second terminal is configured to couple to a second antenna;
a first circuit branch, wherein the common terminal is coupled to the first circuit branch at a branch node and the first circuit branch terminates at the first terminal, and wherein the first circuit branch includes a first quarter wavelength transmission line having a first end electrically coupled to the branch node and a second end electrically coupled to the first terminal;
a second circuit branch, wherein the common terminal is coupled to the second circuit branch at the branch node and the second circuit branch terminates at the second terminal, and wherein the second circuit branch includes a second quarter wavelength transmission line having a first end electrically coupled to the branch node and a second end electrically coupled to the second terminal;
a branch-interconnection arrangement that includes a first resistor, wherein the first terminal and the second terminal are coupled together via the branch-interconnection arrangement;
a first switched arrangement comprising a first switch having a first switch-terminal and a second switch-terminal, wherein the first switch-terminal is coupled to the common terminal, and wherein a second resistor and a first capacitor are arranged in parallel and coupled between the second switch-terminal and a reference terminal, the reference terminal configured to be coupled to a reference voltage; and
a second switched arrangement comprising a second switch having a third switch-terminal and a fourth switch-terminal, wherein the third switch-terminal is coupled to the first terminal, and wherein a third resistor and a second capacitor are arranged in parallel and coupled between the fourth switch-terminal and the reference terminal, and wherein the first quarter wavelength transmission line is coupled between the first switched arrangement and the second switched arrangement.

18. The circuit of claim 1, wherein the branch-interconnection arrangement further comprises:
a third capacitor coupled in series with the first resistor between the first terminal and the second terminal.

19. The circuit of claim 18, wherein the branch-interconnection arrangement further comprises:
a fourth resistor coupled in series with the first resistor and the third capacitor between the first terminal and the second terminal; and
a fourth switch in parallel with the fourth resistor.

* * * * *